United States Patent
Zhao et al.

(10) Patent No.: US 10,280,502 B2
(45) Date of Patent: May 7, 2019

(54) CRUCIBLE STRUCTURE

(71) Applicant: BOE TECHNOLOGY GROUP CO., LTD., Beijing (CN)

(72) Inventors: Dejiang Zhao, Beijing (CN); Hao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 281 days.

(21) Appl. No.: 15/191,622

(22) Filed: Jun. 24, 2016

(65) Prior Publication Data
US 2017/0073804 A1 Mar. 16, 2017

(30) Foreign Application Priority Data

Sep. 11, 2015 (CN) .......................... 2015 1 0580614

(51) Int. Cl.
*C23C 16/00* (2006.01)
*C23C 14/24* (2006.01)

(52) U.S. Cl.
CPC .................. *C23C 14/243* (2013.01)

(58) Field of Classification Search
CPC ............................ C23C 14/243; C23C 14/225
USPC ......................................................... 118/726
See application file for complete search history.

(56) References Cited

U.S. PATENT DOCUMENTS

| | | | | |
|---|---|---|---|---|
| 6,053,981 A | * | 4/2000 | Salokatve | C23C 14/243 118/726 |
| 6,202,591 B1 | * | 3/2001 | Witzman | C23C 14/243 118/723 VE |
| 8,177,912 B2 | | 5/2012 | Oda et al. | |
| 2005/0129848 A1 | * | 6/2005 | Choi | C23C 14/243 427/249.1 |
| 2009/0025885 A1 | | 1/2009 | Buschbeck et al. | |
| 2009/0133629 A1 | * | 5/2009 | Kamikawa | C23C 14/12 118/718 |
| 2012/0174865 A1 | | 7/2012 | Choi et al. | |
| 2013/0337174 A1 | * | 12/2013 | Goebert | C23C 14/24 427/255.395 |
| 2013/0337597 A1 | * | 12/2013 | Kawato | C23C 14/044 438/34 |
| 2016/0305010 A1 | | 10/2016 | Pei et al. | |

FOREIGN PATENT DOCUMENTS

| CN | 101182627 A | 5/2008 |
|---|---|---|
| CN | 101403092 A | 4/2009 |
| CN | 201834962 U | 5/2011 |
| CN | 102586738 A | 7/2012 |

(Continued)

OTHER PUBLICATIONS

English Translation JP h7-022314, Yanagisawa et al., Jan. 1995.*
Chinese Office Action in Chinese Application No. 201510580614.6, dated Apr. 5, 2017 with English translation.

*Primary Examiner* — Keath T Chen
(74) *Attorney, Agent, or Firm* — Collard & Roe, P.C.

(57) ABSTRACT

A crucible structure including a crucible body and a crucible cover. The crucible body includes a crucible bottom wall and a crucible side wall. One end of the crucible side wall is connected to the crucible bottom wall, and the other end of the crucible side wall is provided with the crucible cover. An included angle between the crucible cover and an axial direction of the crucible is an acute angle. The crucible cover is provided with an opening structure.

12 Claims, 6 Drawing Sheets

(56) References Cited

FOREIGN PATENT DOCUMENTS

| | | |
|---|---|---|
| CN | 103924196 A | 7/2014 |
| CN | 104762600 A | 7/2015 |
| JP | H07-22314 A | 1/1995 |
| JP | 2009-228098 A | 10/2009 |
| KR | 10-0794343 B1 | 1/2008 |

* cited by examiner

CRUCIBLE STRUCTURE

CROSS REFERENCE TO RELATED APPLICATIONS

Applicant claims priority under 35 U.S.C. § 119 of Chinese Application No. 201510580614.6 filed on Sep. 11, 2015, the disclosure of which is incorporated by reference.

TECHNICAL FILED

Embodiments of the present disclosure relate to a crucible structure.

BACKGROUND

With increasingly wider application of organic light-emitting diode (OLED) display devices, manufacture methods thereof also become mature gradually. Film layers in the OLED display device can be formed mainly by various ways, such as evaporation, spin coating and inkjet printing, among which the evaporation has been well developed and applied in mass-production. Low-generation product lines usually utilize the evaporation, mostly by using point sources. For an evaporating process using the point source, the point source is located at a certain location in a chamber, it needs to rotate a substrate to allow an evaporation uniformity of the substrate. However, such method of rotating the substrate to allow the evaporation uniformity often results in the substrate subjected to evaporation to be relatively thicker at center region and relatively thinner at edge regions.

SUMMARY

Embodiments of the present disclosure provide a crucible structure.

The crucible structure includes a crucible body and a crucible cover. The crucible body includes a crucible bottom wall and a crucible side wall; one end of the crucible side wall is connected to the crucible bottom wall, and the other end of the crucible side wall is provided with the crucible cover; an included angle between the crucible cover and an axial direction of the crucible is an acute angle; the crucible cover is provided with an opening structure.

For example, the included angle between the crucible cover and the axial direction of the crucible is ranged from 30° to 60°.

For example, the included angle between the crucible cover and the axial direction of the crucible is ranged from 40° to 45°.

For example, the opening structure includes a nozzle.

For example, the nozzle is a slit nozzle, and one or more slit nozzle is provided in the opening structure.

For example, a plurality of slit nozzles is provided in the opening structure, and the plurality of slit nozzles comprises a first slit nozzle located at the middle region and multiple slit nozzles symmetrically distributed at two side regions of the first slit nozzle.

For example, the slit nozzle is extending from a region of the crucible cover far away from the crucible bottom wall towards a region of the crucible cover close to the crucible bottom wall, and a width of an end of the slit nozzle far away from the crucible bottom wall is smaller than a width of an end of the slit of the slit nozzle close to the crucible bottom wall.

For example, a length of the first slit nozzle is longer than a length of each slit nozzle located at two side regions of the first slit nozzle.

For example, the nozzle is a circular nozzle, and one or more circular nozzle is provided in the opening structure.

For example, a plurality of circular nozzles is provided in the opening structure, and a number of the circular nozzles is gradually increased in a direction from being far away from the crucible bottom wall towards being close to the crucible bottom wall.

For example, a plurality of circular nozzles is provided in the opening structure, and the plurality of circular nozzles comprises a first circular nozzle located at the middle region and multiple circular nozzles disposed to surround the first circular nozzle.

For example, a splitter plate is further provided between the crucible cover and the crucible bottom wall, a periphery of the splitter plate is connected to the crucible side wall, and the splitter plate is provided with a plurality of holes penetrating the splitter plate.

For example, among the holes disposed in the splitter plate, a center distance between two adjacent holes is 1.2-1.3 times of a sum of radii of the two holes.

For example, an included angle between the splitter plate and the axial direction of the crucible is an acute angle.

For example, the included angle between the splitter plate and the axial direction of the crucible is ranged from 30° to 60°.

For example, the splitter plate and the crucible cover are disposed in parallel with each other.

For example, a density of the holes in the splitter plate is gradually increased from a region of the splitter plate far away from the crucible bottom wall towards a region of the splitter plate close to the crucible bottom wall.

For example, a distance from the splitter plate to the crucible cover is smaller than a distance from the splitter plate to the crucible bottom wall.

For example, taking a straight line that is passing through a random point on the crucible bottom wall of the crucible body and is parallel to the axial direction of the crucible as a first straight line, then the first straight line is intersected with the splitter plate and the crucible cover, respectively; the first straight line comprises a first line segment between the splitter plate and the crucible bottom wall, and a second line segment between the splitter plate and the crucible cover and a length L1 of the first line segment and a length L2 of the second line segment satisfy $2 \leq L1/L2 \leq 4$.

BRIEF DESCRIPTION OF THE DRAWINGS

Embodiments of the present invention will be described in more detail below with reference to the accompanying drawings to allow an ordinary skill in the art to understand the present invention more clearly, in which.

FIG. 6b is a cross-sectional view taken along A-A' direction in FIG. 6a;

FIG. 7b is a cross-sectional view taken along B-B' direction in FIG. 7a;

DETAILED DESCRIPTION

Technical solutions according to the embodiments of the present disclosure will be described clearly and in details as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Figure 1:
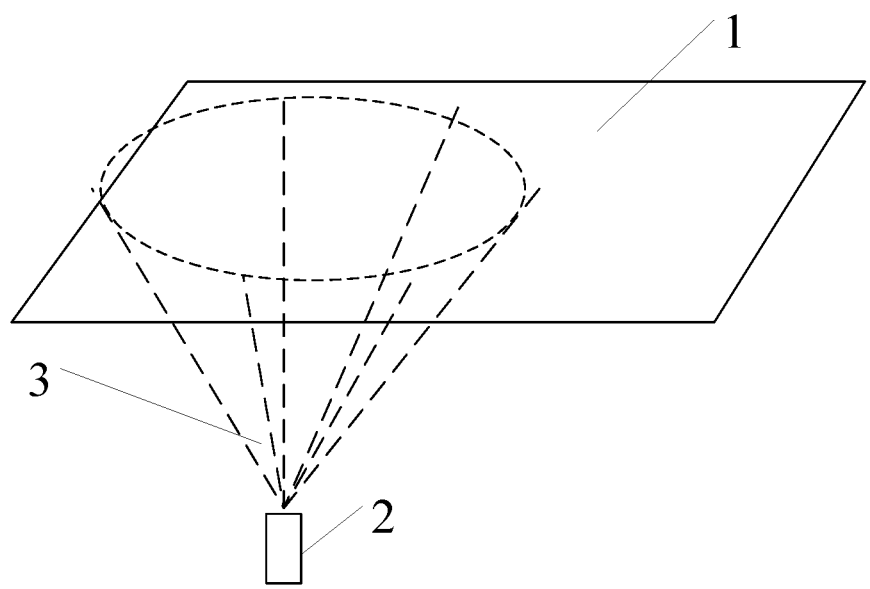
FIG. 1 and FIG. 2 are schematic diagrams illustrating an evaporation process by using a point source.
Figure 2:
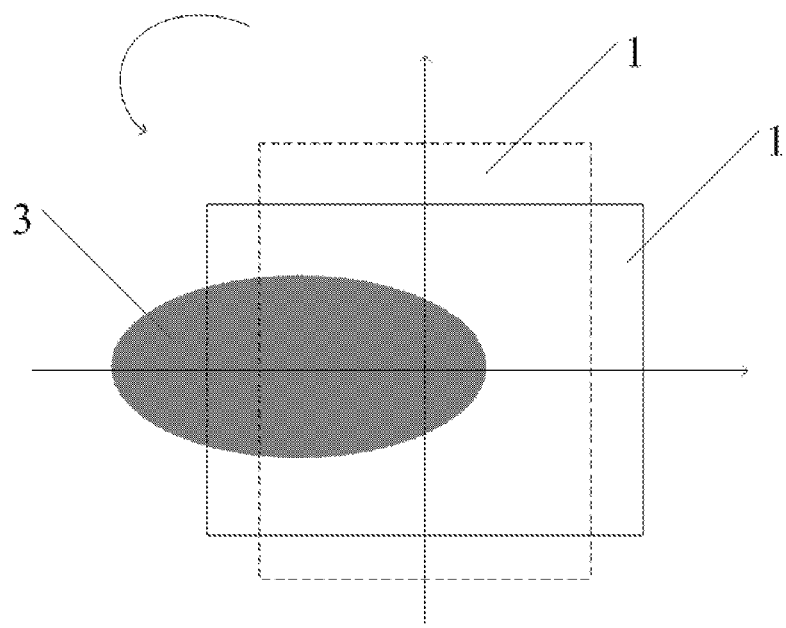

Currently utilized evaporation process by using a point source is illustrated in FIG. 1. In FIG. 1, a material source is placed within a crucible 2; upon heating the material source, an evaporation flow generated by the material source is steamed out of the crucible via an opening at an upper port of the crucible. The evaporation material has a relatively larger density at the exit port of the crucible, and has a relatively smaller density at a location close to a substrate 1. For example, molecules of the evaporation material 3 having been subjected to an evaporation process can obtain a certain initial velocity at the exit port of the crucible attributed to factors, such as heat motion. Afterwards, these molecules will be more or less diffused due to irregular free motion, and cause the evaporation flow to be formed with a cone-like shape. Molecules of the evaporation material 3 close to the substrate 1 are diffused to form a mushroom-like cloud. The circle indicated by dash lines as illustrated in FIG. 1 represents an evaporation range formed by the evaporation material at a same level with respect to the substrate to be evaporated. The inventors has found that, however, for an evaporation method where the material source is placed within the crucible for evaporation, the evaporation material above the crucible as generated by the molecules through diffusion cannot cover the entire substrate; as a result, it usually needs to rotate the substrate 1 so as to allow each region of the substrate 1 to be coated by evaporation. FIG. 2 is a schematic diagram illustrating a rotation of the substrate 1 during the evaporation process. During the evaporation process, the substrate to be evaporated can, for example, always rotate clockwise or counterclockwise in horizontal about a center thereof, so as to allow the oval-shaped evaporation material 3 to be uniformly coated onto the substrate to be evaporated. FIG. 2 illustrates two statuses of the substrate to be evaporated during rotation. It generates a rotation angle of about 90° for the substrate to be evaporated to rotate counterclockwise from a position as indicated by dash lines to a position as indicated by solid lines in FIG. 2. During the rotation, the molecules of a region of the evaporation material 3 still exist outside the center of the substrate 1, which results in an occurrence of overflow evaporation at a central region of the substrate 1, besides normal evaporation. This overflow evaporation will allow a thickness of central region of the substrate 1 being larger than a thickness of periphery region. Although increasing a rotating rate can improve the uniformity to a certain extent, the rotating rate of an evaporation apparatus has an upper limit, on the one hand, and the problem of uneven evaporation cannot be removed merely by increasing the rotation rate.

Figure 3:
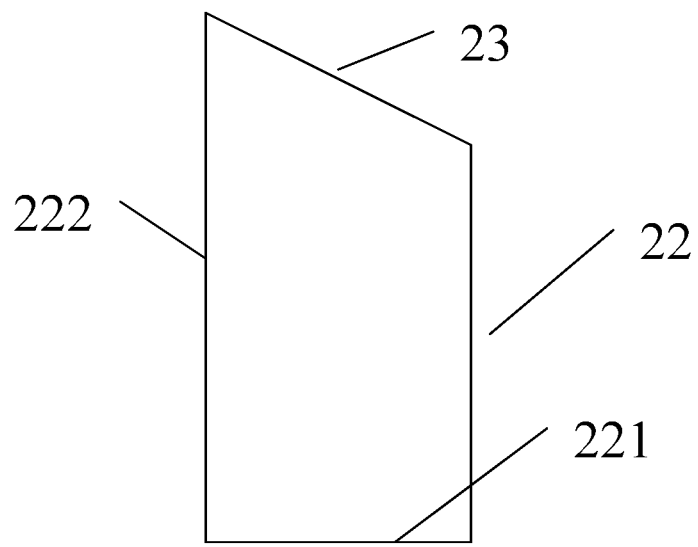
FIG. 3 is a schematically structural diagram illustrating a crucible provided by an embodiment of the present disclosure.

An embodiment of the present disclosure provides a crucible structure, as illustrated in FIG. 3, the crucible structure includes a crucible body 22 and a crucible cover 23. The crucible body 22 includes a crucible bottom wall 221 and a cylindrical, crucible side wall 222. One end of the crucible side wall 222 is connected to the crucible bottom wall 221, and the other end of the crucible side wall 222 is provided with the crucible cover 23. An included angle between the crucible cover 23 and an axial direction of the crucible is an acute angle, and the crucible cover 23 is provided with an opening structure. The embodiment of the present disclosure designs an obliquely arranged crucible cover 23, that is, the crucible cover 23 is designed to have a certain included angle with the axial direction of the crucible in the embodiment of the present disclosure; for example, the included angle can be 30°~60°, for example, 40°~45°. By choosing the angle between the crucible cover 23 and the axial direction of the crucible, it can further increase an evaporation area so as to, for example, achieve an objective of uniform evaporation without a need of rotating the substrate. Herein, an axial line of the crucible refers to a straight line connecting the center of the crucible cover and the center of the crucible bottom wall.

Figure 4:
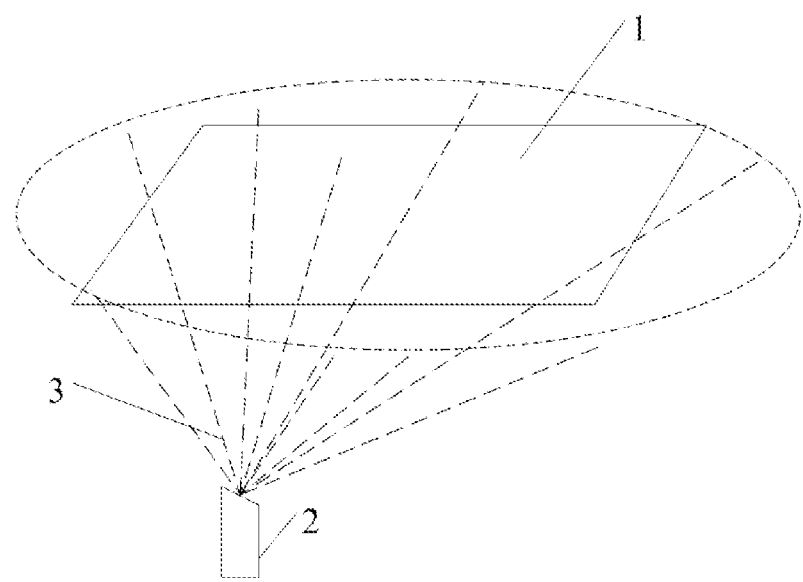
FIG. 4 and FIG. 5 are schematic diagrams illustrating an evaporation process by using a crucible provided by an embodiment of the present disclosure.
Figure 5:
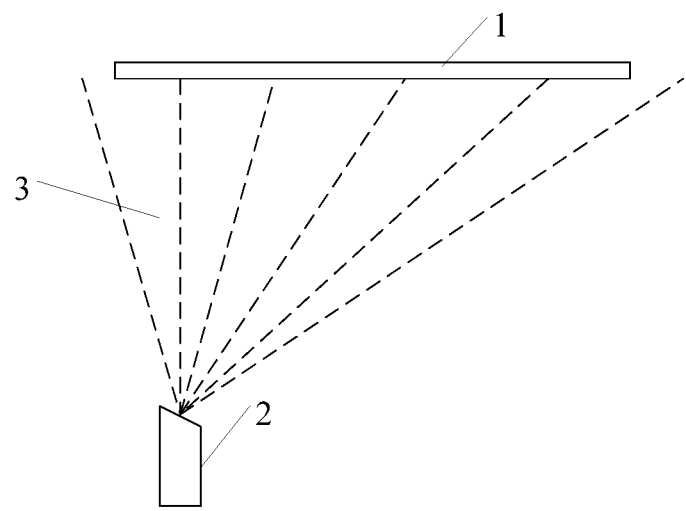

FIG. 4 and FIG. 5 are schematic diagrams illustrating an evaporation process by using a crucible provided by an embodiment of the present disclosure. FIG. 4 is a three-dimensional schematic diagram illustrating an evaporation process by using a crucible provided by an embodiment of the present disclosure. FIG. 5 is a planar schematic diagram illustrating an evaporation process by using a crucible provided by an embodiment of the present disclosure. According to the embodiment of the present disclosure, by obliquely arranging the crucible cover, it can increase a covering area of the evaporation material. Furthermore, by increasing the evaporation area through the oblique crucible cover, it has no need of tilting the crucible and hence prevents melt materials within the crucible from splashing. As it can be seen in conjunction with FIG. 4 and FIG. 5, in which the circle indicated by dash lines in FIG. 4 represents an evaporation range formed by the evaporation material at a height which is the same as a distance from the substrate to be evaporated to the crucible, the evaporation material 3 completely covers the substrate 1. Consequently, the evaporation process to the substrate 1 can be achieved without the need of rotating the substrate 1, and an occurrence of uneven thickness can be avoided.

In order to further improve the evaporation effect, in an embodiment, the opening of the crucible cover 23 is designed as a nozzle structure. Herein the opening structure is referred to as nozzle structure, because it can, for example, change a moving direction of the airflow (refer to a flow of material herein); the opening structure can be enlarged or converged in the moving direction of the airflow so as to diffuse or converge the airflow upon the airflow passing through the opening structure, or the opening structure can be raised from a surface of the crucible cover to extend a moving passage of the airflow towards the outside of the crucible, or the opening structure can be a combination of the above-mentioned two structures. As defined above, the nozzle in the embodiment of the present disclosure is configured to guide the moving direction of the airflow so as to allow the evaporation airflow having passed through the nozzle to be distributed above the crucible with a relatively larger area. The evaporation airflow has a certain pressure within the crucible, it will be changed in velocity, direction and amount when passing through the nozzle, especially, the moving direction of the airflow will be changed according to a direction of a flow passage of the nozzle, consequently, a structure of the airflow passage can be designed according to evaporation requirements, for example, requirement of increasing an area of the evaporation airflow.

In some embodiments, for example, the flow passage of the nozzle can be designed to have an enlarged or flared shape, that is, a structure having an opening gradually expanded along the moving direction of the airflow (that is, a direction from the crucible bottom wall to the crucible cover); so as to allow the airflow to form divergent airflow when passing through such opening, thereby increasing the covering area of the evaporation airflow. For example, such enlarged (or flared) nozzle may or may not be raised from an upper surface of the crucible cover.

Additionally, the nozzle can have various planar shapes, for example, it can be a slit nozzle or a circular nozzle.

Figure 6A:
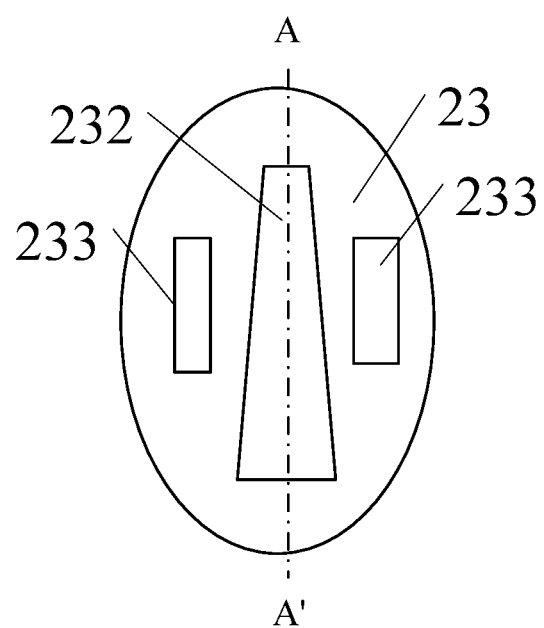
FIG. 6a is a top view illustrating a distribution of slit nozzles on the crucible cover in an embodiment of the present disclosure.
Figure 6B:
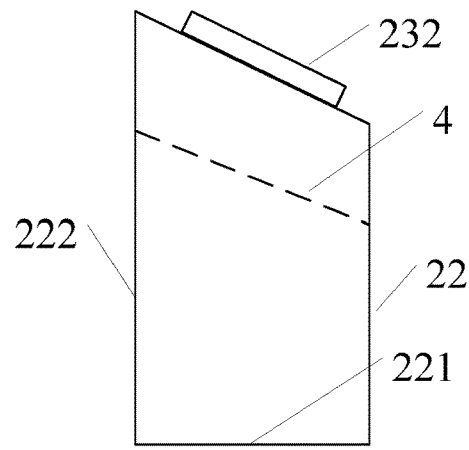
Figure 6C:
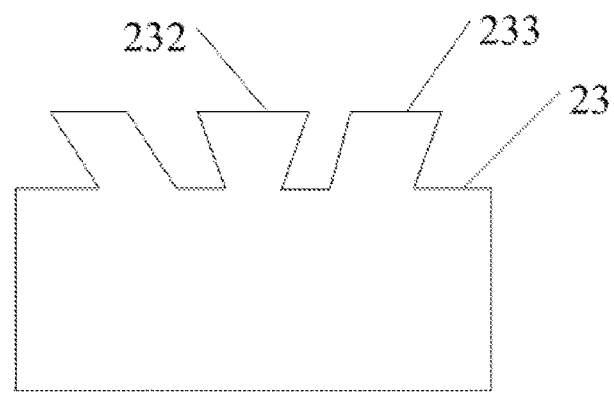
FIG. 6c is a partial cross-sectional view taken along the axial direction of the crucible in FIG. 6a, and perpendicular to central lines of three slit nozzles.

FIG. 6a is a top view illustrating a distribution of slit nozzles in the crucible cover in an embodiment of the present disclosure; FIG. 6b is a cross-sectional view taken along A-A' direction in FIG. 6a; FIG. 6c is partial cross-sectional view taken along an axial line of the crucible in FIG. 6a and perpendicular to central lines of three slit nozzles. As illustrated in FIG. 6a, total three slit nozzles 232, 233 are disposed in the crucible cover, these three slit nozzles can be, for example, extending from a region of the crucible cover 23 relatively far away from the crucible bottom wall 221 towards a region of the crucible cover 23 relatively close to the crucible bottom wall 221. A length of the slit nozzle 232 located at the middle region is longer than a length of the slit nozzle 233 located at two side regions of the crucible cover 23. In addition, as illustrated in FIG. 6b, a width of an opening of the slit nozzle at an end relatively far away from the crucible bottom wall 221 is, for example, smaller than a width of an opening of the slit nozzle at an end relatively close to the crucible bottom wall 221. For example, a width of the slit of the slit nozzle can be designed to be gradually increased from an end relatively far away from the crucible bottom wall 221 towards an end relatively close to the crucible bottom wall 221; that is, a width of the slit of the slit nozzle is gradually changed along a length direction of the slit. In this way, the airflow ejected from the slit nozzle can be formed into a more uniform evaporation airflow at a same level (that is, having a same distance from the substrate to be evaporated) above the crucible cover 23, so as to improve the evaporation uniformity. For example, it is also possible to design the slit nozzle 232 located at the middle region and each of the slit nozzles 233 located at two side regions of the slit nozzle 232 to have a ratio of length of 5:4 to 7:4; in this way, the evaporation airflow above the crucible is more uniform.

Refer to FIG. 6c, a cross section of the slit nozzle 232 located at the middle region that is taken along the axial direction of the crucible and is perpendicular to a central line of the slit has a substantially trapezoidal structure. This trapezoidal structure enables the airflow to be diverged towards two side regions of the slit nozzle 232 by following the guidance of the slit nozzles 232, 233, which can slow the velocity of the airflow so that the airflow having passed through the nozzle can be more uniform and also can direct the evaporation airflow to be diffused outwardly to further increase the evaporation area. A cross section of each of the slit nozzles 233 located at two side regions that is perpendicular to the central line of the slit and taken along the axial direction of the crucible is substantially a parallelogram, or can be a quadrilateral with only two edges in parallel; two bevel edges (sides) of the above-mentioned trapezoidal structure are each substantially parallel to one or two edges of a parallelogram located at the side corresponding to the respective bevel edges.

On such basis, it is possible to design a plurality of slit nozzles on the crucible cover with the central lines of the slit nozzles being parallel to each other, and to adjust a distance between central lines of the slits of two adjacent slit nozzles according to a density of the evaporation airflow, a size of the substrate to be evaporated and a distance from the slit nozzle to the substrate to be evaporated, so as to allow more uniform evaporation airflow. It is also possible to design the crucible cover to be provided with an odd number of slit nozzles with a length of a first slit nozzle located at the middle region being larger than a length of the slit nozzle located at two side regions of the first slit nozzle; or, the odd number of slit nozzles can be designed in such a manner that the slit nozzles located at two side regions are symmetrical with respect to the first slit nozzle located at the middle region so as to allow the evaporation airflow to become more uniform upon passing through the slit nozzles.

Figure 7A:
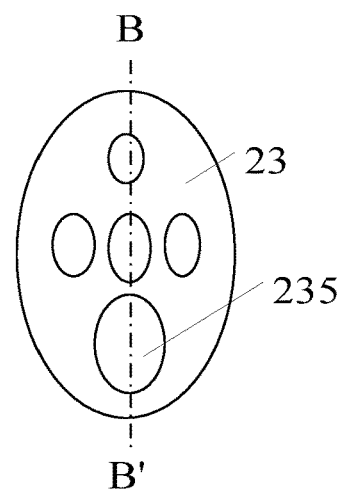
FIG. 7a is a schematic diagram illustrating a distribution of circular nozzles on the crucible cover in an embodiment of the present disclosure.
Figure 7B:
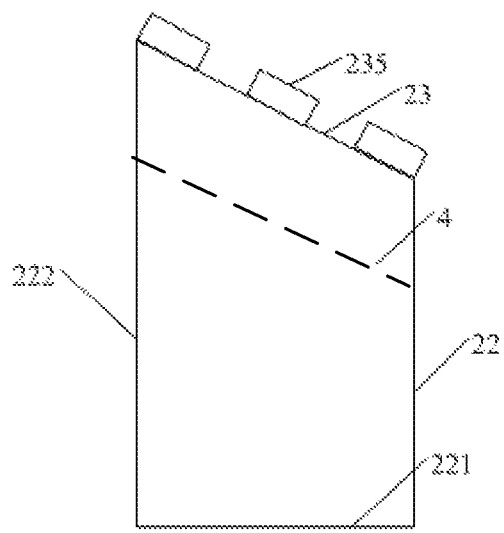

In an embodiment, the nozzle can be a circular nozzle. With reference to FIG. 7a and 7b, FIG. 7a is a top view illustrating a distribution of circular nozzles on the crucible cover in an embodiment of the present disclosure, while FIG. 7b is a cross-sectional view taken along B-B' direction in FIG. 7a. FIG. 7a illustrates total five circular nozzles distributed on the crucible cover, these circular nozzles 235 for example can be substantially distributed over an entire surface of the crucible cover 23. As illustrated in FIG. 7a, the crucible cover can be divided into three regions according to a distance to the crucible bottom wall, including: a first region relatively far away from the crucible bottom wall 221, and the first region is provided with a relatively small-sized circular nozzle; a second region relatively close to the crucible bottom wall, and the second region is provided with a relatively large-sized circular nozzle; and a third region between the first region and the second region, and the third region is provided with three circular nozzles. A size of the circular nozzle at a region of the crucible cover relatively close to the crucible bottom wall 221 can be, for example, 2-3 times of a size of the circular nozzle at a region of the crucible cover relatively far away from the crucible bottom wall 221. FIG. 7b illustrates surfaces of these circular nozzles 235 which are, for example, raised from a surface of the crucible cover 23. The circular nozzles 235 may also not be, for example, raised from the surface of the crucible cover 23.

As an embodiment of the present disclosure, for example, circular nozzles 235 with a same size can be adopted, but a distribution density of the circular nozzles at a region of the crucible cover 23 far away from the crucible bottom wall 221 is smaller than a distribution density of the circular nozzles at a region of the crucible cover 23 close to the crucible bottom wall. Similarly, it is also possible to design the circular nozzles 235 to have different sizes; that is, on the surface of the crucible cover 21, the distribution density of the circular nozzles at the region far away from the crucible bottom wall 221 is identical with the distribution density of the circular nozzles at the region close to the crucible bottom wall 221, but the circular nozzles at the region close to the crucible bottom wall 221 have relatively large size to allow more uniform evaporation airflow. This is because the region close to the crucible bottom wall 221 has a longer distance from the substrate 1 to be evaporated above the crucible and requires for relatively larger amount of evaporation airflow to allow uniform evaporation airflow above the crucible.

In addition, it is also possible to adopt a design in which the nozzles are disposed in a surrounding way, that is, to design a relatively larger-sized circular nozzle to be adjacent to a substantially central region on the crucible cover 23 and a plurality of circular nozzles to surround the relatively larger-sized circular nozzle. An airflow, upon passing through the relatively larger-sized circular nozzle, is formed into an evaporation airflow with relatively larger area above the relatively larger-sized circular nozzle, and also upon passing through the circular nozzles surround the relatively larger-sized circular nozzle, the uniformity of the evaporation airflow there-above can be further adjusted. For example, a diameter of the circular nozzle located at the middle region is 2-3 times of a diameter of the circular nozzles disposed to surround the circular nozzle located at the middle region, and a number of the circular nozzles disposed to surround the circular nozzle located at the middle region is 3-6. For example, it is also possible to design the circular nozzle located at the middle region to have a shape of nonstandard circular, that is, to have a radian at a region far away from the crucible bottom wall 221 larger than a radian at a region relatively close to the crucible bottom wall 221, so as to further improve the uniformity of the evaporation airflow.

For example, a flow passage of the circular nozzle can also adopt a structure having a variable diameter. For example, the circular nozzle 235 is designed to form an enlarged or flared-like flow passage along a moving direction of the airflow (that is, a direction from the crucible bottom wall to the crucible cover) so that the airflow having passed through such flow passage can form a divergent flow. For example, a structure in which a diameter of the flow passage is slowly increased in the moving direction of the airflow can be adopted, so as to slow the velocity of the airflow and also to allow the airflow having passed through the circular nozzle 235 to be diffused outwardly, and the evaporation area is increased and the evaporation uniformity is improved.

The shape of the nozzle in the embodiments of the present disclosure is not limited to slit or circular but can be any regular shapes, such as regular hexagon and regular octagon, or can be irregular shapes, and an inner wall of the flow passage in these nozzles is not limited to planar structures, either, but it also can be curved structures. All of these examples fall within the scope of the present disclosure.

Figure 8A:
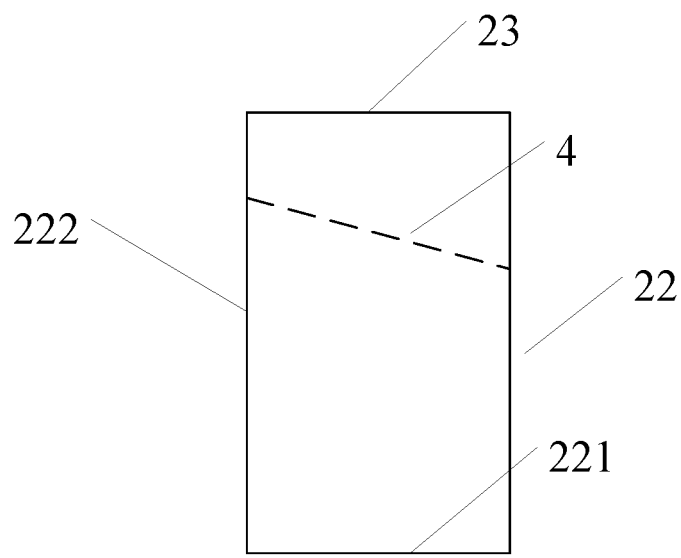
FIG. 8a is a perspective side view illustrating a crucible provided with a splitter plate in an embodiment of the present disclosure.

An embodiment of the present disclosure further designs a splitter plate. FIG. 8*a* is a perspective side view illustrating a crucible provided with a splitter plate in an embodiment of the present disclosure. As illustrated in FIG. 8*a*, a splitter plate 4 is, for example, disposed between the crucible cover 23 and the crucible bottom wall 221, and a periphery of the splitter plate 4 is, for example, connected to the crucible side wall. The splitter plate 4 is distributed with holes penetrating the splitter plate 4. The splitter plate 4 has a shape which can, for example, match with a shape of an inner chamber of the crucible so as to decrease leakage at an interface between the evaporation airflow and the inner wall of the crucible, and the splitting effect is improved. The arrangement of the splitter plate allows pre-distribution of the evaporation airflow and also decreases an impact of the evaporation airflow to the crucible cover, and the evaporation effect is improved.

Figure 8B:
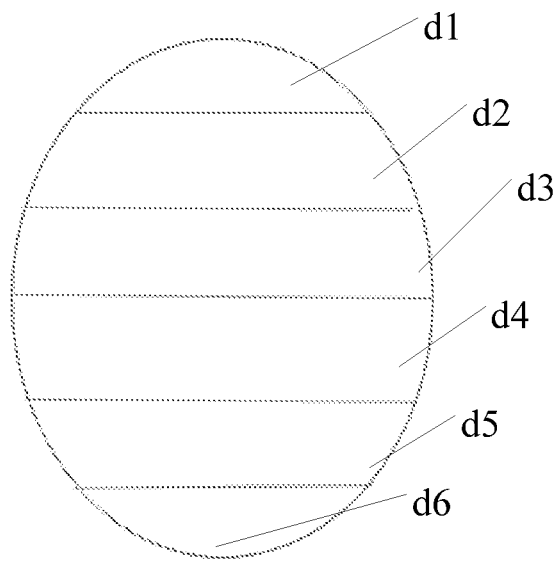
FIG. 8b is a top view illustrating a distribution of holes in the splitter plate in an embodiment of the present disclosure.

In an embodiment, a density of holes in the splitter plate is gradually increased from a region far away from the crucible bottom wall 221 towards a region close to the crucible bottom wall 221. FIG. 8*b* is a top view illustrating a distribution of holes in an oval-shaped in a splitter plate. With reference to FIG. 8*b*, the splitter plate 4 is divided into total six regions from one end to the other end, that is, d1~d6. The region d1 corresponds to a region relatively far away from the crucible bottom wall 221, and the region d6 corresponds to a region relatively close to the crucible bottom wall 221. A density of the holes in the splitter plate is designed to be gradually increased from the region d1 to the region d6, so as to allow the evaporation airflow to be formed into a gradient airflow upon passing through the splitter plate 4. The term "density" as used herein refers to a number of holes in a unit area given that these holes have similar sizes. The more the holes in a unit area, the larger the density is. The term can also be interpreted as an overall area of the holes. However, these holes need to be distributed in the splitter plate in a relatively uniform manner so as to improve the uniformity of the evaporation airflow having passed through the splitter plate.

In an embodiment, the design for the distribution of the holes in the splitter plate 4 can be optimized; for example, a center distance between two adjacent holes can be designed to be 1.2-1.3 times of a sum of radii of the two holes, which can further improve gradient distribution effect and uniformity effect brought by the holes to the evaporation airflow.

In an embodiment, with reference to FIGS. 6*b*, 7*b* and 8*a*, the splitter plate can be disposed in such a manner that an included angle between the splitter plate and the axial direction of the crucible is an acute angle, for example, the included angle can be ranged from 30° to 60°. By adjusting the included angle between the splitter plate and the axial direction of the crucible, the split effect can be further improved and the evaporation airflow can have a gradient distribution upon passing through the splitter plate.

Figure 9:
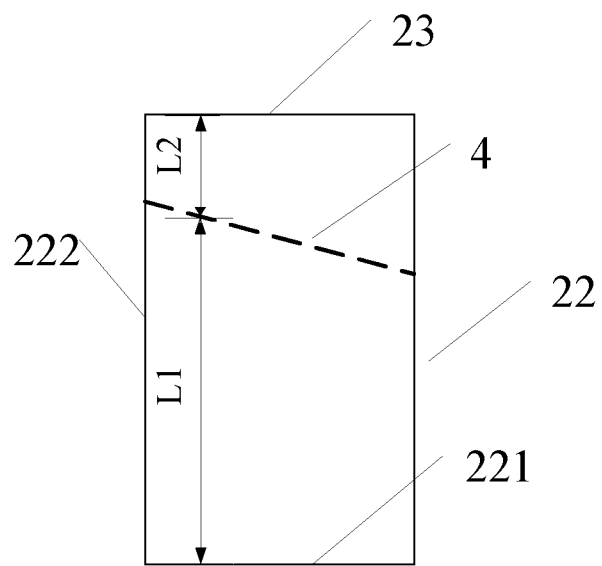
FIG. 9 is a schematic diagram illustrating a location arrangement of the splitter plate in an embodiment of the present disclosure.

In an embodiment, a distance from the splitter plate 4 to the crucible cover 23 is smaller than a distance from the splitter plate 4 to the crucible bottom wall 221 so as to prevent the airflow with gradient distribution as formed upon passing through the splitter plate 4 from aggregating again due to a long distance from the crucible cover 23. In order to further improve the gradient distribution effect as brought by the splitter plate 4 to the airflow, a location of the splitter plate 4 disposed between the crucible cover 23 and the crucible bottom wall 221 can be optimized. With reference to FIG. 9, for example, taking a straight line that is passing through a random point on the crucible bottom wall 221 and is parallel to the axial direction of the crucible as a first straight line, then the first straight line is intersected with the splitter plate 4 and the crucible cover 23, respectively. The first straight line includes a first line segment between the splitter plate 4 and the crucible bottom wall 221, and a second line segment between the splitter plate 4 and the crucible cover 23. A length L1 of the first line segment and a length L2 of the second line segment satisfy $2 \leq L1/L2 \leq 4$.

The splitter plate 4 as provided in the embodiments of the present disclosure can be applied to crucible structures in which the crucible cover 23 is designed to be oblique, as illustrated in FIG. 6*a* and FIG. 7*a*. FIG. 6*b* illustrates the splitter plate applied in a crucible structure which adopts slit nozzles and an oblique crucible cover; FIG. 7b illustrates the splitter plate applied in a crucible structure which adopts circular nozzles and an oblique crucible cover. Also, such splitter plate can be applied to crucible structures which adopt a crucible cover with flat top, as illustrated in FIG. 8a. By utilizing the splitter plate as provided by the embodiments of the present disclosure, it can achieve pre-distribution of the evaporation airflow, and obtain an evaporation airflow with gradient distribution.

The above embodiments can be combined with each other, and the combined solutions also fall within the scope of the present disclosure with even better combined effects.

The described above are only illustrative embodiments of the present disclosure, and the present disclosure is not intended to limited thereto. For a person of ordinary skill in the art, various modifications and improvements can be made without departing from the spirit and scope of the present disclosure, and all of which shall fall within the scope of the present disclosure.

The present application claims the benefits of the priority of Chinese patent application No. 201510580614.6 filed on Sep. 11, 2015 and entitled "CRUCIBLE STRUCTURE", which is incorporated entirely herein by reference.

What is claimed is:

1. A crucible structure, comprising a crucible body and a crucible cover, wherein the crucible body comprises a crucible bottom wall and a crucible side wall, one end of the crucible side wall is connected to the crucible bottom wall, and the other end of the crucible side wall is provided with the crucible cover, an included angle between the crucible cover and an axial direction of the crucible is an acute angle, and the crucible cover is provided with an opening structure, the opening structure comprising a plurality of slit nozzles, the plurality of slit nozzles comprising a first slit nozzle located at the middle region and multiple slit nozzles symmetrically distributed at two side regions of the first slit nozzle, the first slit nozzle having a length longer than that of each slit nozzle located at the two side regions of the first slit nozzle; wherein the first slit nozzle is trapezoidal in shape with two ends, with one end of said two ends being closer to the crucible bottom wall being wider than the opposite end of said two ends.

2. The crucible structure according to claim 1, wherein the included angle between the crucible cover and the axial direction of the crucible is ranged from 30° to 60°.

3. The crucible structure according to claim 1, wherein the included angle between the crucible cover and the axial direction of the crucible is ranged from 40° to 45°.

4. The crucible structure according to claim 1, wherein a splitter plate is further provided between the crucible cover and the crucible bottom wall, a periphery of the splitter plate is connected to the crucible side wall, and the splitter plate is provided with a plurality of holes penetrating the splitter plate.

5. The crucible structure according to claim 4, wherein among the holes disposed in the splitter plate, a center distance between two adjacent holes is 1.2-1.3 times of a sum of radii of the two holes.

6. The crucible structure according to claim 4, wherein an included angle between the splitter plate and the axial direction of the crucible is an acute angle.

7. The crucible structure according to claim 6, wherein the included angle between the splitter plate and the axial direction of the crucible is ranged from 30° to 60°.

8. The crucible structure according to claim 4, wherein the splitter plate and the crucible cover are disposed in parallel with each other.

9. The crucible structure according to claim 6, wherein a density of the holes in the splitter plate is gradually increased from a region of the splitter plate far away from the crucible bottom wall towards a region of the splitter plate close to the crucible bottom wall.

10. The crucible structure according to claim 4, wherein a distance from the splitter plate to the crucible cover is smaller than a distance from the splitter plate to the crucible bottom wall.

11. The crucible structure according to claim 10, wherein taking a straight line that is passing through a random point on the crucible bottom wall of the crucible body and is parallel to the axial direction of the crucible as a first straight line, the first straight line is intersected with the splitter plate and the crucible cover, respectively; the first straight line comprises a first line segment between the splitter plate and the crucible bottom wall, and a second line segment between the splitter plate and the crucible cover and a length L1 of the first line segment and a length L2 of the second line segment satisfy 2≤L1/L2≤4.

12. A crucible structure, comprising a crucible body and a crucible cover, wherein the crucible body comprises a crucible bottom wall and a crucible side wall, one end of the crucible side wall is connected to the crucible bottom wall, and the other end of the crucible side wall is provided with the crucible cover, an included angle between the crucible cover and an axial direction of the crucible is an acute angle, and the crucible cover is provided with an opening structure, the opening structure comprising a plurality of slit nozzles, the plurality of slit nozzles comprising a first slit nozzle located at the middle region and multiple slit nozzles symmetrically distributed at two side regions of the first slit nozzle, the first slit nozzle having a length longer than that of each slit nozzle located at the two side regions of the first slit nozzle, wherein the slit nozzle is extending from a region of the crucible cover far away from the crucible bottom wall towards a region of the crucible cover close to the crucible bottom wall, and a width of an end of a slit of the slit nozzle far away from the crucible bottom wall is smaller than a width of an end of the slit of the slit nozzle close to the crucible bottom wall; wherein the first slit nozzle is trapezoidal in shape with two ends, with one end of said two ends being closer to the crucible bottom wall being wider than the opposite end of said two ends.

* * * * *